(12) United States Patent
Yang et al.

(10) Patent No.: US 11,342,294 B2
(45) Date of Patent: May 24, 2022

(54) SEMICONDUCTOR DEVICE AND METHOD OF FORMING PROTRUSION E-BAR FOR 3D SIP

(71) Applicant: STATS ChipPAC Pte. Ltd., Singapore (SG)

(72) Inventors: DeokKyung Yang, Incheon-Si (KR); HunTeak Lee, Gyeongi-do (KR); OhHan Kim, In-Cheon (KR); HeeSoo Lee, Kyunggi-do (KR); DaeHyeok Ha, Kyunggi-do (KR); Wanil Lee, Incheon-Si (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 16/821,093

(22) Filed: Mar. 17, 2020

(65) Prior Publication Data

US 2020/0219835 A1    Jul. 9, 2020

Related U.S. Application Data

(62) Division of application No. 16/027,731, filed on Jul. 5, 2018, now Pat. No. 10,636,756.

(51) Int. Cl.
*H01L 23/00* (2006.01)
*H01L 23/538* (2006.01)
*H01L 23/31* (2006.01)

(52) U.S. Cl.
CPC .......... *H01L 24/08* (2013.01); *H01L 23/3107* (2013.01); *H01L 23/3114* (2013.01); *H01L 23/3121* (2013.01); *H01L 23/3128* (2013.01); *H01L 23/538* (2013.01); *H01L 24/45* (2013.01); *H01L 2224/32145* (2013.01); *H01L 2224/32225* (2013.01); *H01L 2224/48227* (2013.01); *H01L 2224/73204* (2013.01); *H01L 2224/73253* (2013.01); *H01L 2924/15331* (2013.01)

(58) Field of Classification Search
None
See application file for complete search history.

(56) References Cited

U.S. PATENT DOCUMENTS 6,781,241 B2    8/2004  Nishimura et al.
9,786,623 B2   10/2017  Lin
(Continued)

*Primary Examiner* — Reema Patel
(74) *Attorney, Agent, or Firm* — Robert D. Atkins; Patent Law Group: Atkins and Associates, P.C.

(57) ABSTRACT

A semiconductor device has a first substrate and a semiconductor die disposed over the first substrate. A second substrate has a multi-layered conductive post. The conductive post has a first conductive layer and a second conductive layer formed over the first conductive layer. The first conductive layer is wider than the second conductive layer. A portion of the conductive post can be embedded within the second substrate. The second substrate is disposed over the first substrate adjacent to the semiconductor die. An encapsulant is deposited around the second substrate and semiconductor die. An opening is formed in the second substrate aligned with the conductive post. An interconnect structure is formed in the opening to contact the conductive post. A discrete electrical component is disposed over a surface of the first substrate opposite the semiconductor die. A shielding layer is formed over the discrete electrical component.

22 Claims, 17 Drawing Sheets

(56) References Cited

U.S. PATENT DOCUMENTS

| | | |
|---|---|---|
| 2002/0158318 A1 | 10/2002 | Chen |
| 2007/0187818 A1 | 8/2007 | Lyne |
| 2009/0133908 A1 | 5/2009 | Goodner et al. |
| 2014/0048906 A1* | 2/2014 | Shim ................ H01L 24/19 |
| | | 257/531 |
| 2015/0115466 A1* | 4/2015 | Kim .................. H01L 23/28 |
| | | 257/774 |
| 2016/0043047 A1 | 2/2016 | Shim et al. |
| 2016/0172261 A1 | 6/2016 | Hsu et al. |
| 2017/0033082 A1* | 2/2017 | Lin ............... H01L 23/49838 |
| 2017/0040304 A1 | 2/2017 | Shih et al. |
| 2019/0229046 A1 | 7/2019 | Tsai et al. |

\* cited by examiner

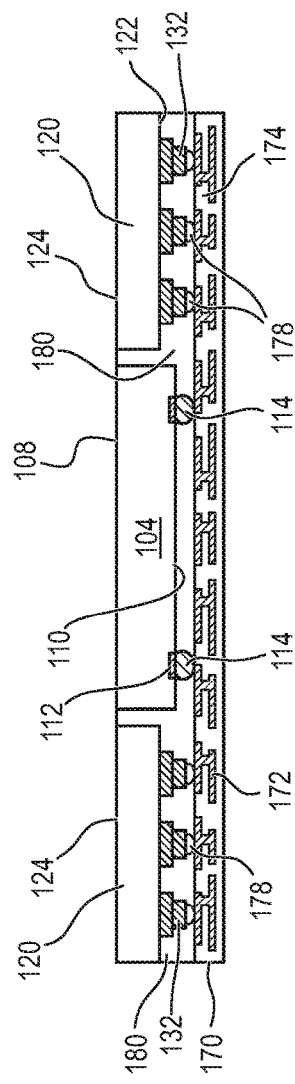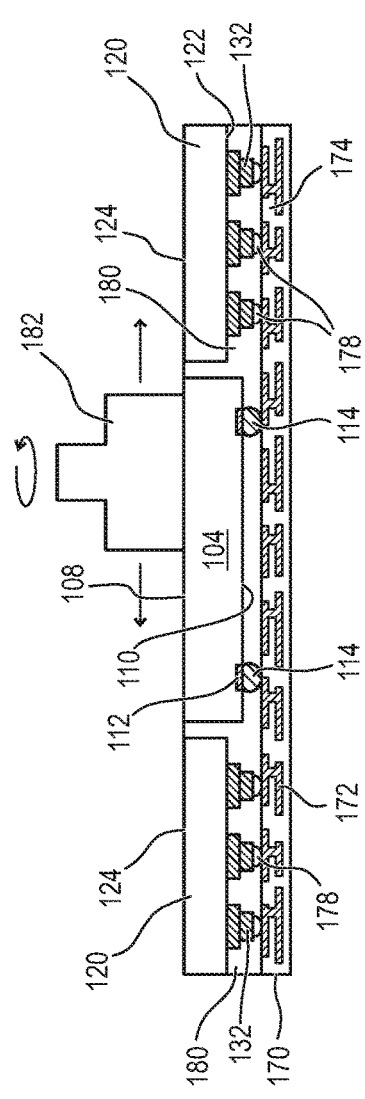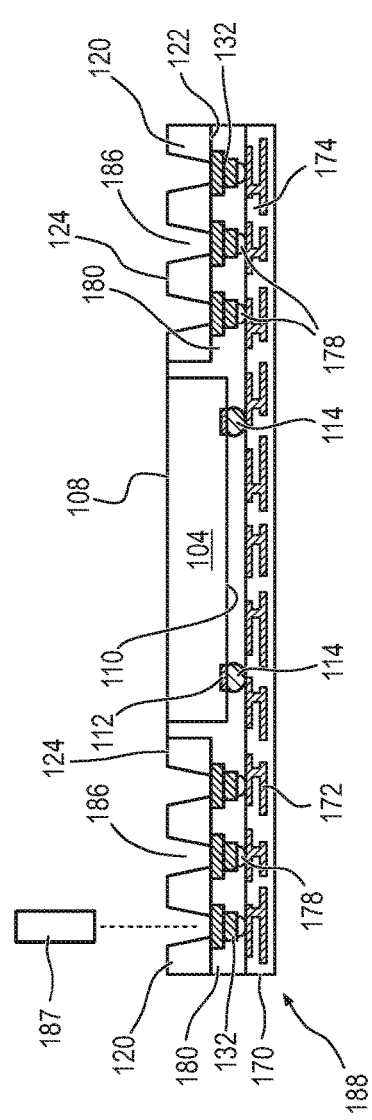

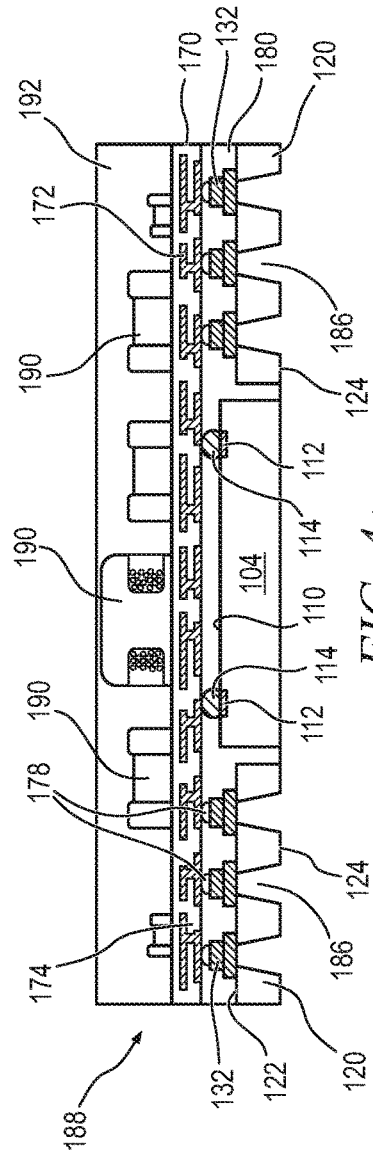
FIG. 4g
FIG. 4h
FIG. 4i
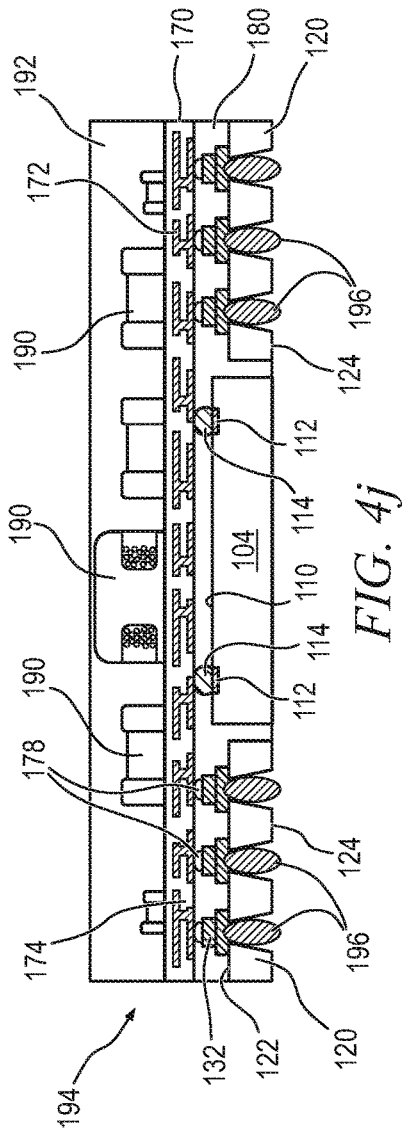
FIG. 4j

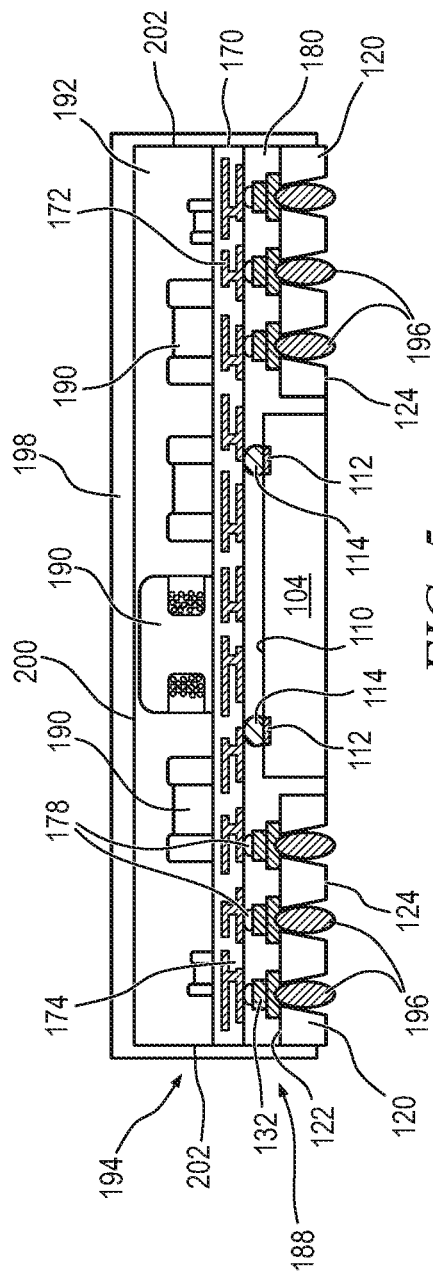
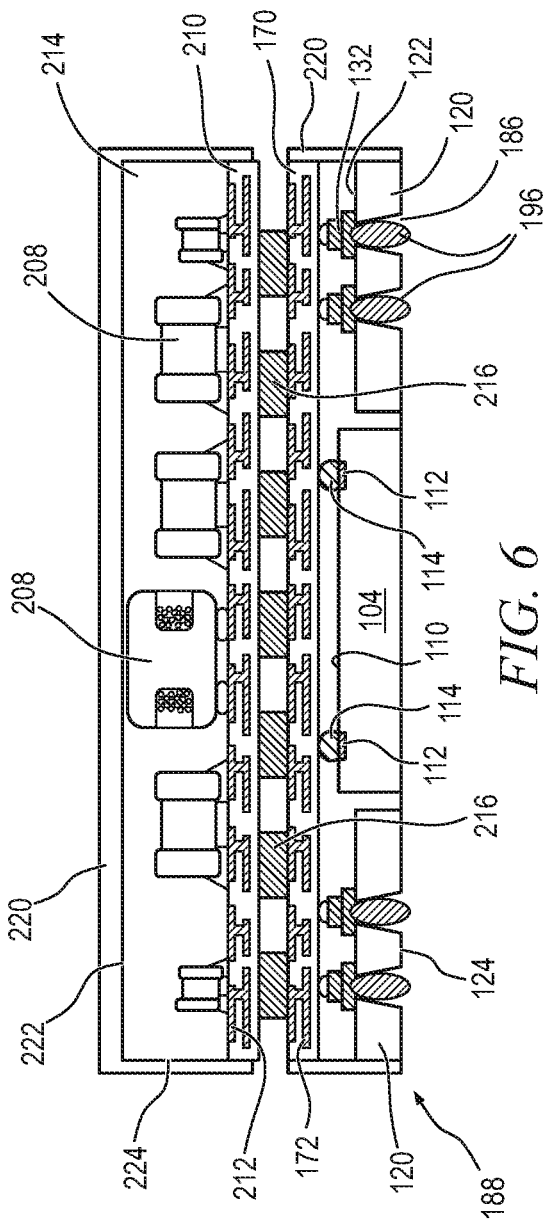

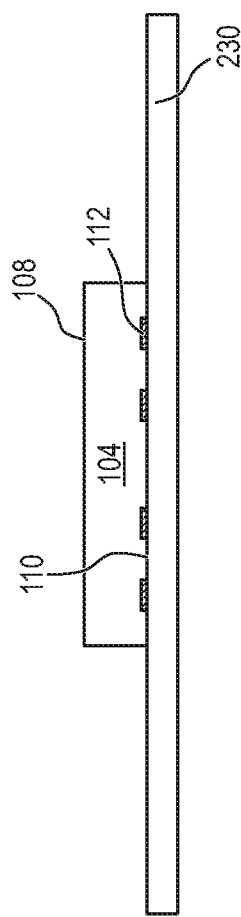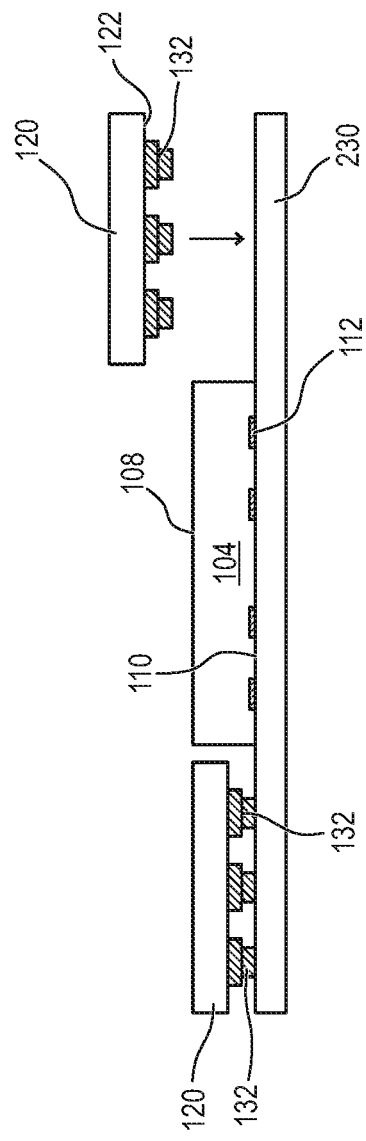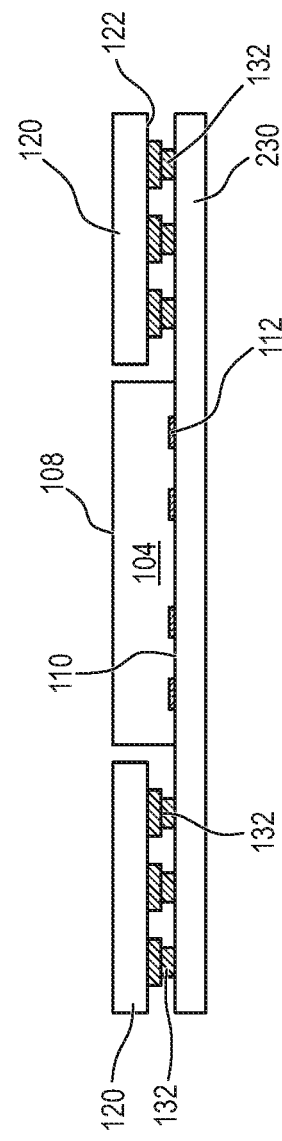

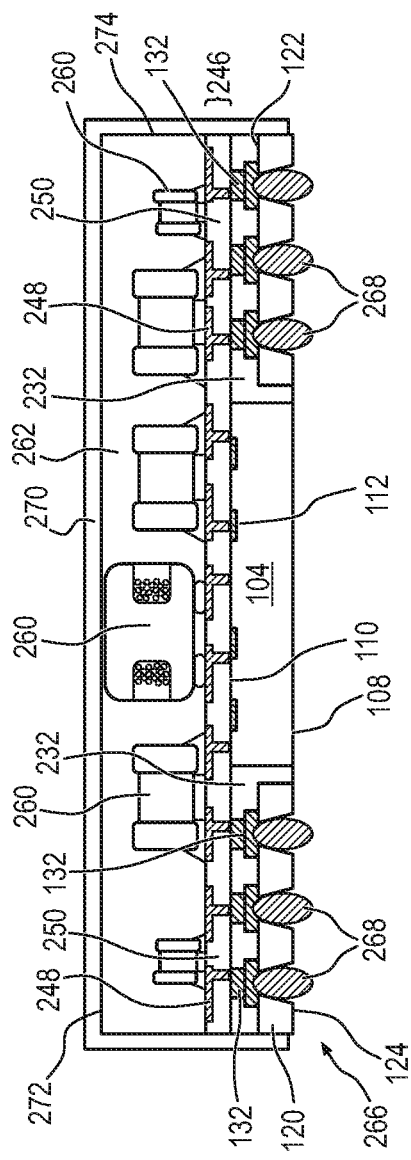

SEMICONDUCTOR DEVICE AND METHOD OF FORMING PROTRUSION E-BAR FOR 3D SIP

CLAIM TO DOMESTIC PRIORITY

The present application is a division of U.S. patent application Ser. No. 16/027,731, now U.S. Pat. No. 10,636,756, filed Jul. 5, 2018, which application is incorporated herein by reference.

FIELD OF THE INVENTION

The present invention relates in general to semiconductor devices and, more particularly, to a semiconductor device and method of forming a substrate with a conductive post as a protrusion e-bar for a 3D integrated system-in-package.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications such as radio frequency (RF) wireless communications, often contain one or more integrated passive devices (IPDs) to perform necessary electrical functions. The IPDs are susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generate interference.

Semiconductor packages are commonly made with several active semiconductor components, discrete passive components, and integrated passive devices (IPDs) disposed together into a single-package system, also known as a system-in-package (SiP). The SiP offers higher density and enhanced electrical functionality relative to traditional semiconductor packaging. Within the SiP, the active and passive components are mounted to a first substrate for structural support and electrical interconnect. A second substrate disposed adjacent to the semiconductor die provides vertical electrical interconnect. There is typically a narrow gap between the first substrate and second substrate which reduces the flow of encapsulant and may lead to void formation.

BRIEF DESCRIPTION OF THE DRAWINGS

FIGS. 4a-4j illustrate forming a 3D SiP with a substrate having conductive posts around a semiconductor die;

FIG. 5 illustrates the 3D SiP of FIGS. 4a-4j with a shielding layer over the discrete component;

FIG. 6 illustrates another 3D SiP with a discrete component and shielding layer over the discrete component;

FIGS. 7a-7j illustrate forming a 3D SiP with a substrate having conductive posts and semiconductor die disposed over first and second carriers;

FIG. 9 illustrates the 3D SiP of FIGS. 8a-8c with a shielding layer over the discrete component;

FIG. 10 illustrates the 3D SiP of FIGS. 8a-8c with a shielding layer over the discrete component and encapsulant over the semiconductor die;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
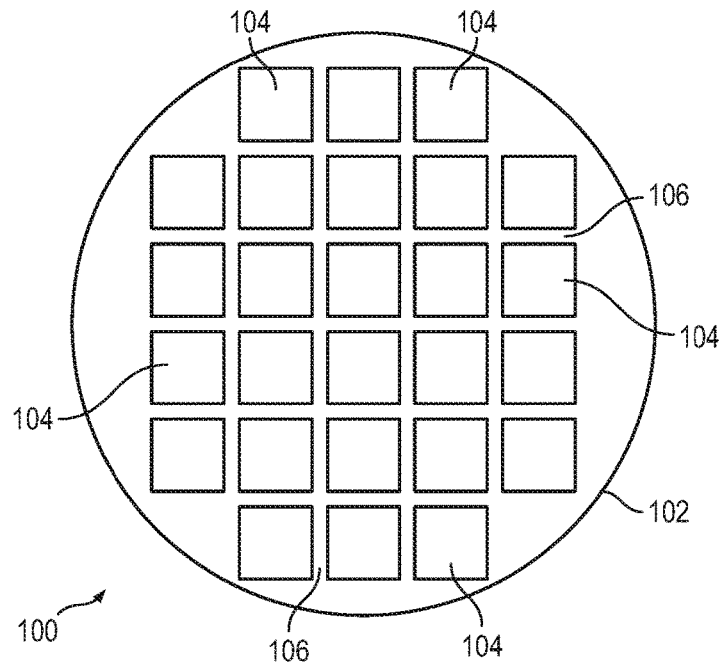
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
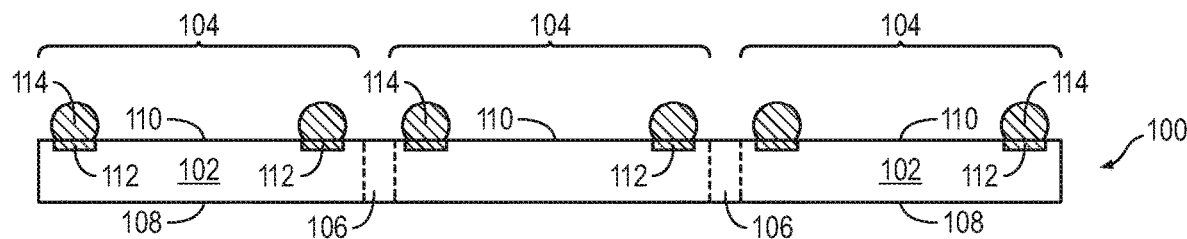

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as a digital signal processor (DSP), application specific integrated circuit (ASIC), memory, or other signal processing circuit. Semiconductor die 104 may also contain IPDs, such as inductors, capacitors, and resistors formed in or on interconnect layers over surfaces of the semiconductor die for RF signal processing.

An electrically conductive layer 112 is formed over active surface 110 using PVD, CVD, electrolytic plating, electroless plating, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits of active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In some embodiments, the bump material is reflowed by heating the material above its melting point to form balls or bumps 114. In one embodiment, bump 114 is formed over an under bump metallization (UBM) having a wetting layer, a barrier layer, and an adhesion layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
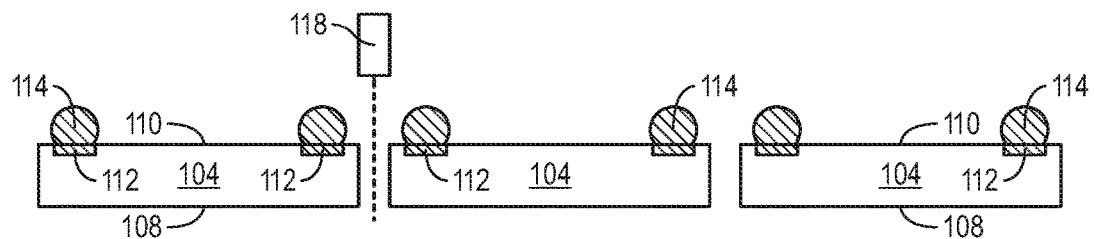

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die (KGD) after singulation.

Figure 2A:
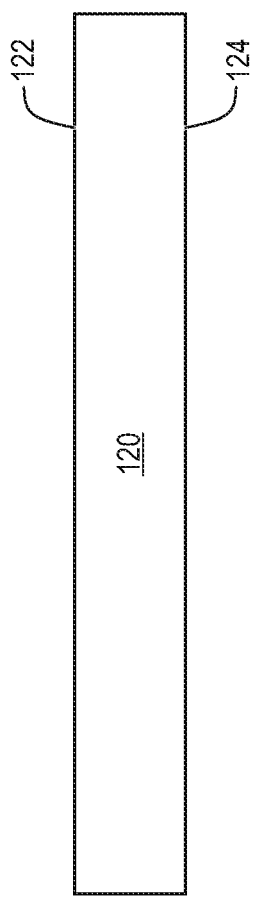
FIGS. 2a-2c illustrate a process of forming an interconnect substrate panel with conductive posts.
Figure 2B:
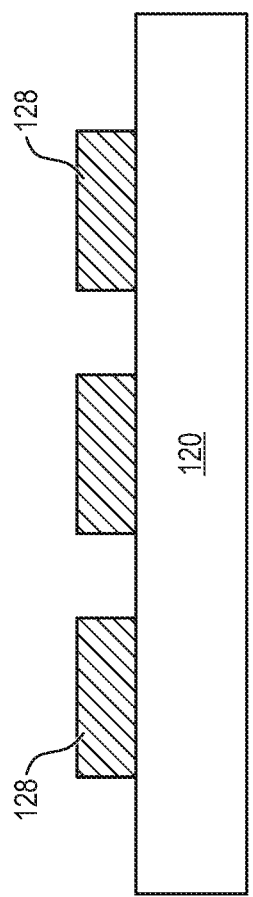
Figure 2C:
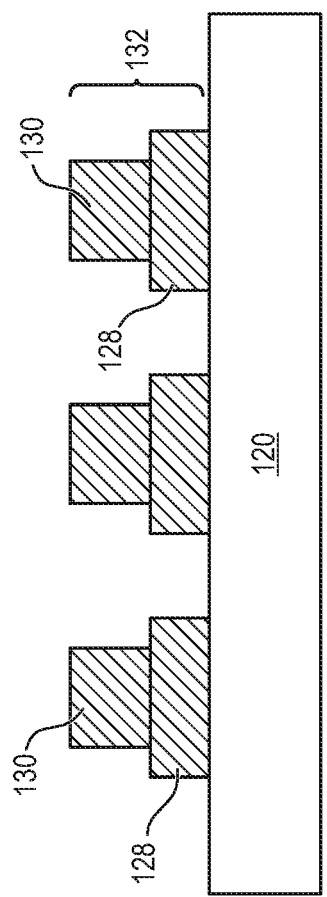

FIGS. 2a-2c illustrate a process of forming a protrusion e-bar as a substrate or panel with multi-layered conductive posts. FIG. 2a shows a cross-sectional view of substrate or panel 120 made of one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Substrate 120 can also be a multi-layer flexible laminate, ceramic, copper clad laminate, glass, epoxy molding compound, or semiconductor wafer including an active surface containing one or more transistors, diodes, and other circuit elements to implement analog or digital circuits. In another embodiment, substrate 120 can also be any suitable laminate interposer, PCB, wafer-form, strip interposer, leadframe, or other type of substrate. Substrate 120 may include one or more laminated layers of polytetrafluoroethylene (PTFE) pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Substrate 120 includes first major surface 122 and second major surface 124 opposite surface 122.

In FIG. 2b, conductive layer 128 is formed over surface 122 of substrate 120 using PVD, CVD, electrolytic plating, electroless plating process, or other suitable metal deposition process. Conductive layer 128 can be one or more layers of Al, Cu, Sn, Ni, Au, Ag, or other suitable electrically conductive material. Conductive layer 128 is patterned as contact pads and can be electrically connected to other traces within substrate 120.

In FIG. 2c, conductive layer 130 is formed over conductive layer 128 using PVD, CVD, electrolytic plating, electroless plating process, or other suitable metal deposition process. Conductive layer 130 can be one or more layers of Al, Cu, Sn, Ni, Au, Ag, or other suitable electrically conductive material. The combination of conductive layers 128-130 operate as multi-layered conductive post 132 on substrate 120 to form a protrusion e-bar. Conductive layer 128 is wider than conductive layer 130 for alignment and tolerance of conductive post 132.

Figure 3A:
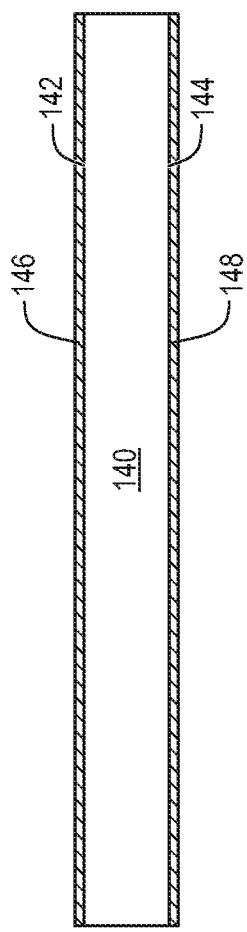
FIGS. 3a-3f illustrate another process of forming an interconnect substrate panel with partially embedded conductive posts.

FIGS. 3a-3e illustrate another process of forming a protrusion e-bar as a substrate or panel with multi-layered embedded conductive posts. FIG. 3a shows a cross-sectional view of core substrate 140 made of one or more layers of SiO2, Si3N4, SiON, Ta2O5, Al2O3, solder resist, polyimide, BCB, PBO, epoxy molding compound, and other material having similar insulating and structural properties. Core substrate 140 includes first major surface 142 and second major surface 144 opposite surface 142. Optional seed layer 146 is formed over surface 142, and optional seed layer 148 is formed over surface 144.

Figure 3B:
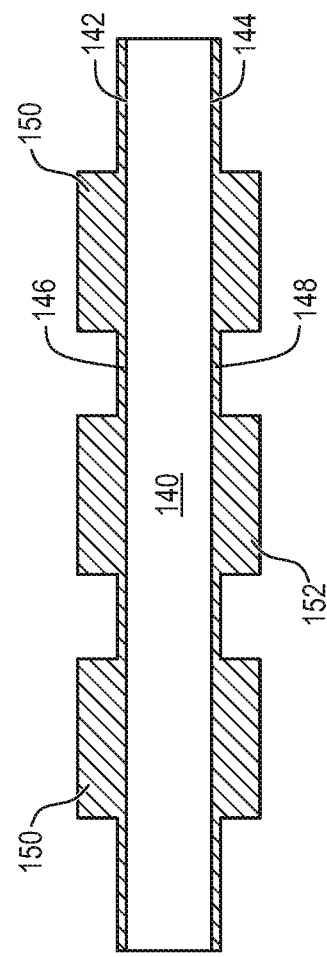

In FIG. 3b, conductive layer 150 is formed over surface 142 and seed layer 146, and conductive layer 152 is formed over surface 144 and seed layer 148 using PVD, CVD, electrolytic plating, electroless plating process, or other suitable metal deposition process. Conductive layers 150-152 can be one or more layers of Al, Cu, Sn, Ni, Au, Ag, or other suitable electrically conductive material. Conductive layers 150-152 are patterned as contact pads.

Figure 3C:
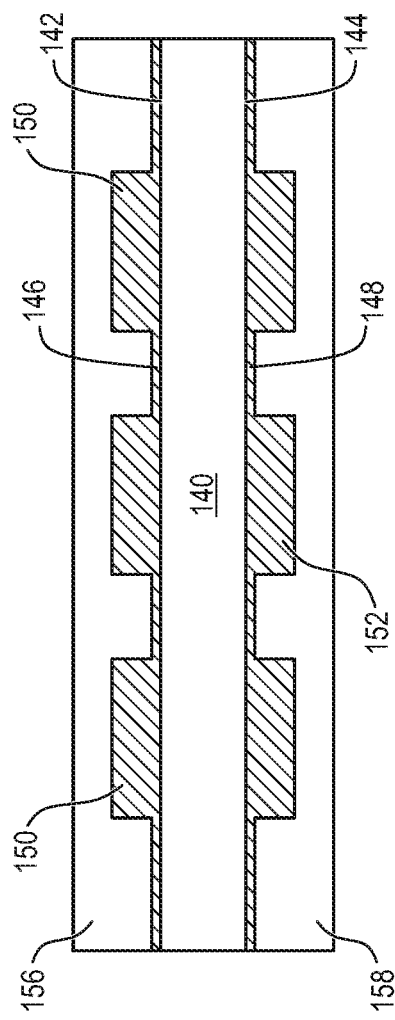

In FIG. 3c, an insulating layer 156 is formed over seed layer 146 and conductive layer 150 using PVD, CVD, printing, lamination, spin coating, spray coating, sintering, or thermal oxidation. Likewise, insulating layer 158 is formed over seed layer 148 and conductive layer 152. The insulating layers 156-158 contain one or more layers of SiO2, Si3N4, SiON, Ta2O5, Al2O3, solder resist, polyimide, BCB, PBO, and other material having similar insulating and structural properties. Insulating layers 156-158 can also be a multi-layer flexible laminate, ceramic, copper clad laminate, glass, or epoxy molding compound. In another embodiment, Insulating layers 156-158 can also be any suitable laminate interposer, PCB, wafer-form, strip interposer, leadframe, or other type of substrate. Insulating layers 156-158 may include one or more laminated layers of PTFE, prepreg, FR-4, FR-1, CEM-1, or CEM-3 with a combination of phenolic cotton paper, epoxy, resin, woven glass, matte glass, polyester, and other reinforcement fibers or fabrics.

Figure 3D:
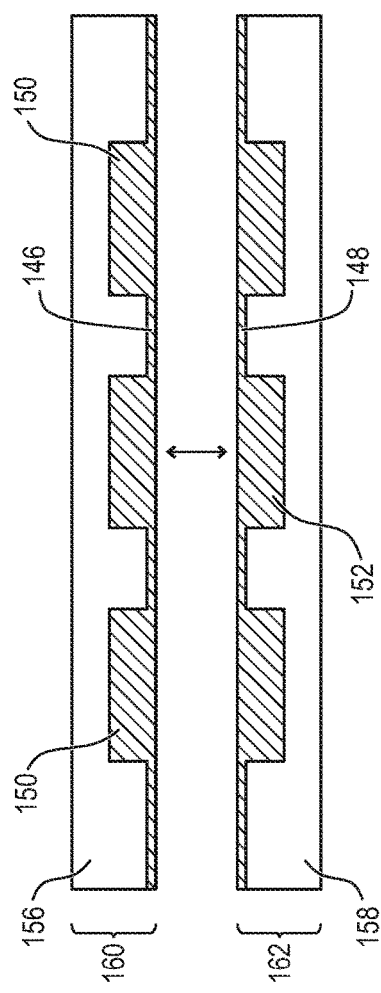

In FIG. 3d, core substrate 140 is removed leaving substrate or panel 160 with embedded conductive layer 150, and substrate or panel 162 with embedded conductive layer 152.

Figure 3E:
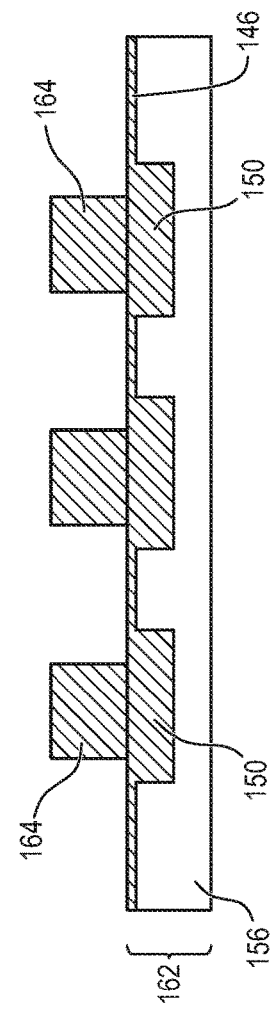
Figure 3F:
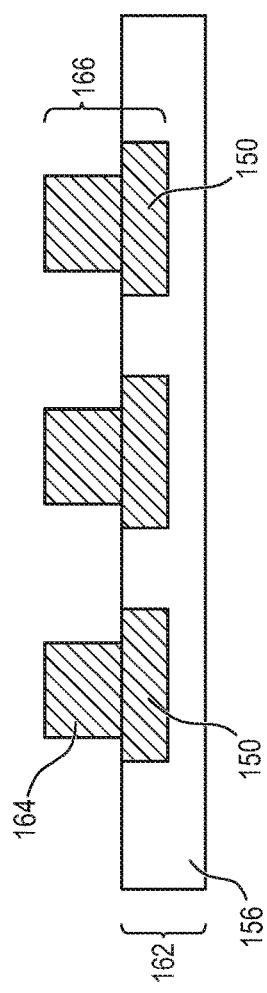

In FIG. 3e, conductive layer 164 is formed over conductive layer 150 using PVD, CVD, electrolytic plating, electroless plating process, or other suitable metal deposition process. Conductive layer 164 can be one or more layers of Al, Cu, Sn, Ni, Au, Ag, or other suitable electrically conductive material. The combination of conductive layers 150 and 164 operate as multi-layered, partially embedded conductive post 166 to form another embodiment of the protrusion e-bar. In FIG. 3f, seed layers 146 and 148 are removed by an etching process. The same process occurs for substrate 162 to provide another substrate with multi-layered, partially embedded conductive post 166 (protrusion e-bar).

Figure 4A:
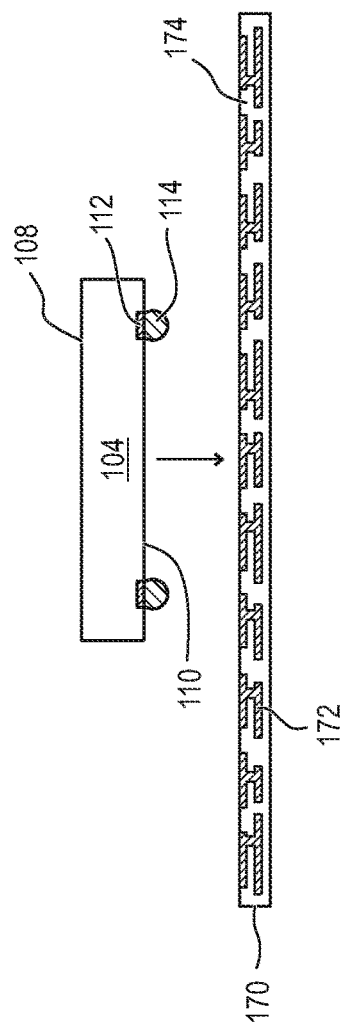
Figure 4B:
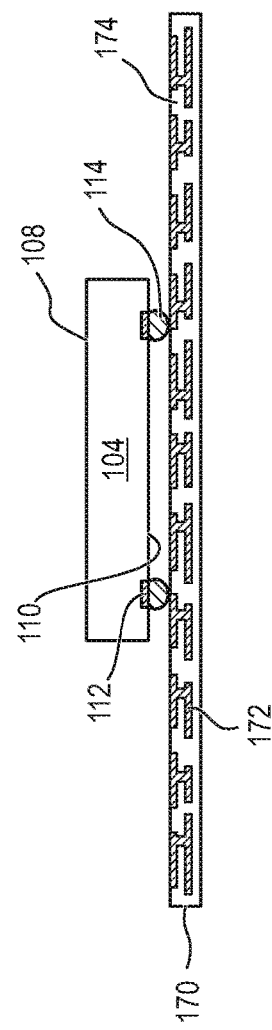
Figure 4C:
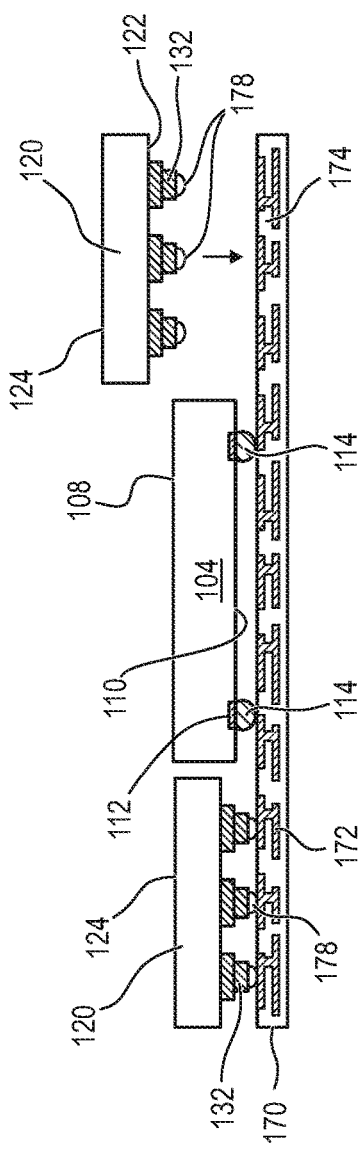

FIGS. 4a-4j illustrate a process of forming a 3D SiP with a substrate having conductive posts (protrusion e-bar) around a semiconductor die for electrical interconnect. In FIG. 4a, substrate 170 includes conductive layers/vias 172 with insulating layers 174. Semiconductor die 104 is disposed over and mounted to substrate 170 with a pick and place operation and bumps 114 are bonded to conductive layer 172. Substrate 170 provides vertical and horizontal electrical interconnect completely through the substrate for semiconductor die 104. FIG. 4b shows semiconductor die 104 mounted to substrate 170. In FIG. 4c, substrate 120 with conductive posts 132 is disposed over a portion of substrate 170 outside semiconductor die 104 with a pick and place operation. The discussion of substrate 120 and conductive posts 132 applies to the embodiment of substrate 160/162 with conductive post 166. FIG. 4d shows substrate 120 with conductive posts 132 mounted to substrate 170 adjacent to semiconductor die 104. Conductive posts 132 is bonded to conductive layer 172 with solder, solder paste, or bump material 178.

In FIG. 4d, an encapsulant or molding compound 180 is deposited around and under semiconductor die 104 and substrate 120 and conductive posts 132 using a paste printing, compressive molding, transfer molding, liquid encapsulant molding, vacuum lamination, spin coating, or other suitable applicator. Encapsulant 180 can be polymer composite material, such as epoxy resin, epoxy acrylate, or polymer with or without a proper filler. Encapsulant 180 is non-conductive, provides structural support, and environmentally protects the semiconductor device from external elements and contaminants. In FIG. 4e, grinder 182 removes a portion of encapsulant 180, back surface 108 of semiconductor die 104, and surface 124 of substrate 120.

In FIG. 4f, a plurality of vias 186 is formed into surface 124 of substrate 120 using etching, drilling, or laser direct ablation (LDA) with laser 187. Vias 186 are aligned with and extend to conductive posts 132. FIG. 4f shows assembly 188 to the state of the manufacturing process.

In FIG. 4g, discrete electrical components 190 are surface-mounted onto conductive layer 172 of substrate 170 opposite substrate 120 and semiconductor die 104. Discrete electrical components 190 are mechanically bonded and electrically connected to conductive layer 172 with solder or solder paste. In one embodiment, solder paste is printed onto substrate 170, reflowed with discrete electrical components 190 in physical contact, and then defluxed. Discrete electrical components 190 include inductors, resistors, capacitors, transistors, diodes, and any combination of active and passive devices to implement the intended functionality of the 3D SiP.

An encapsulant or molding compound 192 is deposited around and over discrete electrical components 190 using a paste printing, compressive molding, transfer molding, liquid encapsulant molding, vacuum lamination, spin coating, or other suitable applicator. Encapsulant 192 can be polymer composite material, such as epoxy resin, epoxy acrylate, or polymer with or without a proper filler. Encapsulant 192 is non-conductive, provides structural support, and environmentally protects the semiconductor device from external elements and contaminants.

FIG. 4h shows further detail of substrate 120 with multi-layered conductive posts 132 (protrusion e-bar), encapsulant 180, and vias 186. FIG. 4i shows further detail of the embodiment of substrate 160/162 with multi-layered, partially embedded conductive posts 166 (protrusion e-bar), encapsulant 180, and vias 186.

FIG. 4j shows 3D SiP 194 with substrate 120 having conductive posts 132 (protrusion e-bar) around semiconductor die 104. An electrically conductive bump material is deposited within vias 186 over the exposed conductive posts 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive posts 132 using a suitable attachment or bonding process. In some embodiments, the bump material is reflowed by heating the material above its melting point to form balls or bumps 196. In one embodiment, bump 196 is formed over a UBM having a wetting layer, a barrier layer, and an adhesion layer. Bump 196 can also be compression bonded or thermocompression bonded to contact conductive posts 132. Bump 196 represents one type of interconnect structure that can be formed over conductive posts 132. The interconnect structure can also use bond wires, conductive paste, stud bump, micro bump, or other electrical interconnect.

The 3D SiP 194 with protrusion e-bar 120/132 or 160/166 or 162/166 provides electrical interconnect for semiconductor die 104. Conductive post 132/166 maintains stand-off, i.e., wide gap between substrate 120 and substrate 170, during reflow, as well as improving flow of encapsulant 180. The protrusion e-bar also provides rigidity to reduce warpage and defects in bumps 196. Conductive post 132/166 reduces occurrence of an electrical bridge or short. The 3D SiP 194 can be formed at the wafer level.

Semiconductor die 104 or discrete electrical components 190 may contain IPDs that are susceptible to or generate EMI, RFI, harmonic distortion, and inter-device interference. For example, the IPDs contained within semiconductor die 104 or discrete electrical components 190 provide the electrical characteristics needed for high-frequency applications, such as resonators, high-pass filters, low-pass filters, band-pass filters, symmetric Hi-Q resonant transformers, and tuning capacitors. In another embodiment, semiconductor die 104 or discrete electrical components 190 contains digital circuits switching at a high frequency, which could interfere with the operation of IPDs in adjacent semiconductor packages.

FIG. 5 shows an embodiment with shielding layer 198 formed over top surface 200 and side surface 202 of encapsulant 192, as well as the side surfaces of assembly 188. Shielding layer 198 can be one or more layers of Al, Cu, Sn, Ni, Au, Ag, or other suitable conductive material. Alternatively, shielding layer 198 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference.

FIG. 6 shows an embodiment with discrete electrical components 208 bonded to substrate 210 containing conductive layers 212 for horizontal and vertical electrical interconnect. Encapsulant 214 is deposited over discrete electrical components 208 and substrate 210. Components with the same reference numbers as FIG. 4f provide a similar function. Substrate 210 is bonded to substrate 170 of assembly 188 with bumps or other electrical interconnect 216. Shielding layer 220 is formed over top surface 222 and side surface 224 of encapsulant 214, as well as the side surfaces of substrate 210 and assembly 188. Shielding layer 220 can be one or more layers of Al, Cu, Sn, Ni, Au, Ag, or other suitable conductive material. Alternatively, shielding layer 220 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference.

Figure 7D:
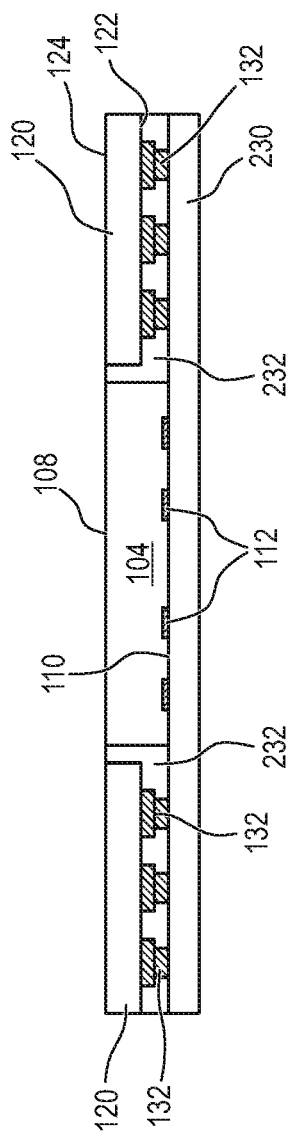

FIGS. 7a-7j illustrate an alternate process of forming a 3D SiP with a substrate having conductive posts (protrusion e-bar) around a semiconductor die. In FIG. 7a, substrate or carrier 230 contains temporary or sacrificial base material such as silicon, germanium, gallium arsenide, indium phosphide, silicon carbide, resin, beryllium oxide, glass, or other suitable low-cost, rigid material for structural support. Semiconductor die 104 from wafer 100 (without bumps 114) is mounted to carrier 230 using a pick and place operation.

Figure 7E:
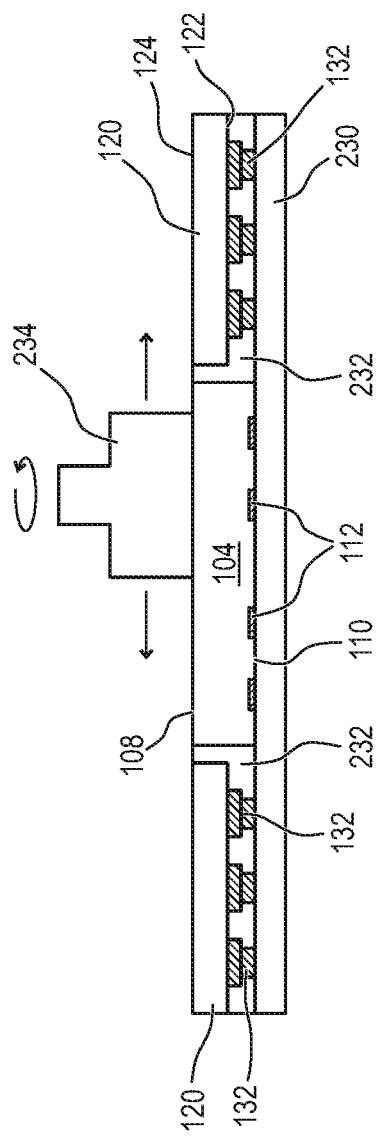

In FIG. 7b, substrate 120 with conductive posts 132 from FIGS. 2a-2c is disposed over a portion of carrier 230 outside semiconductor die 104 with a pick and place operation. The discussion of substrate 120 and conductive posts 132 applies to the embodiment of substrate 160/162 with conductive post 166. FIG. 7c shows substrate 120 with conductive posts 132 disposed on carrier 230 adjacent to semiconductor die 104. In FIG. 7d, an encapsulant or molding compound 232 is deposited around and under semiconductor die 104 and substrate 120 and conductive posts 132 using a paste printing, compressive molding, transfer molding, liquid encapsulant molding, vacuum lamination, spin coating, or other suitable applicator. Encapsulant 232 can be polymer composite material, such as epoxy resin, epoxy acrylate, or polymer with or without a proper filler. Encapsulant 232 is non-conductive, provides structural support, and environmentally protects the semiconductor device from external elements and contaminants. In FIG. 7e, grinder 234 removes a portion of encapsulant 232, back surface 108 of semiconductor die 104, and surface 124 of substrate 120.

Figure 7F:
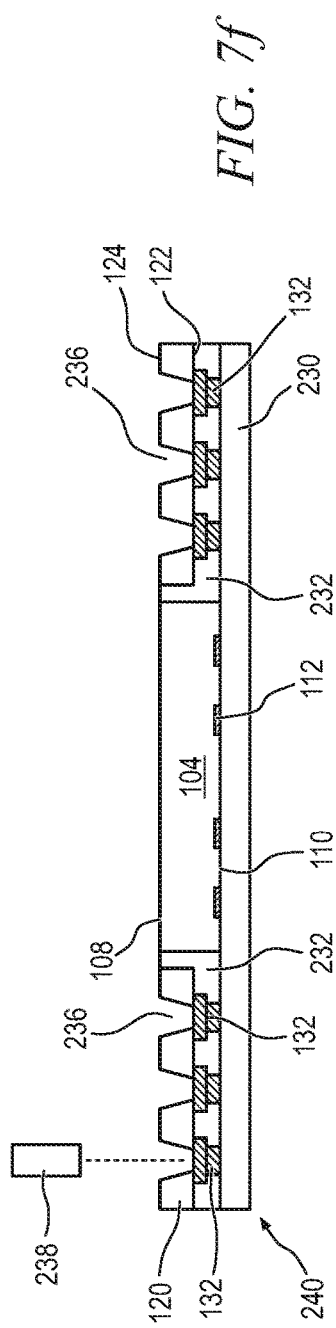

In FIG. 7f, a plurality of vias 236 is formed into surface 124 of substrate 120 using etching, drilling, or LDA with laser 238. Vias 236 are aligned with and extend to conductive posts 132. FIG. 7f shows assembly 240 to the state of the manufacturing process.

Figure 7G:
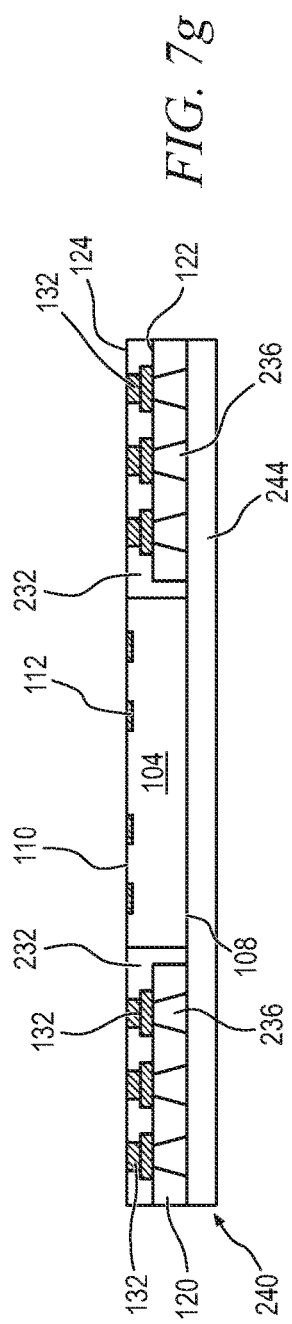

In FIG. 7g, assembly 240 is removed from carrier 230 by chemical etching, mechanical peel-off, chemical mechanical planarization (CMP), mechanical grinding, thermal bake, laser scanning, or wet stripping to expose active surface 110 of semiconductor die 104 and conductive posts 132. Assembly 240 is inverted and mounted to substrate or carrier 244, which contains temporary or sacrificial base material such as silicon, germanium, gallium arsenide, indium phosphide, silicon carbide, resin, beryllium oxide, glass, or other suitable low-cost, rigid material for structural support. Active surface 110 and conductive posts 132 are oriented away from carrier 244, while vias 236 are oriented toward carrier 244.

Figure 7H:
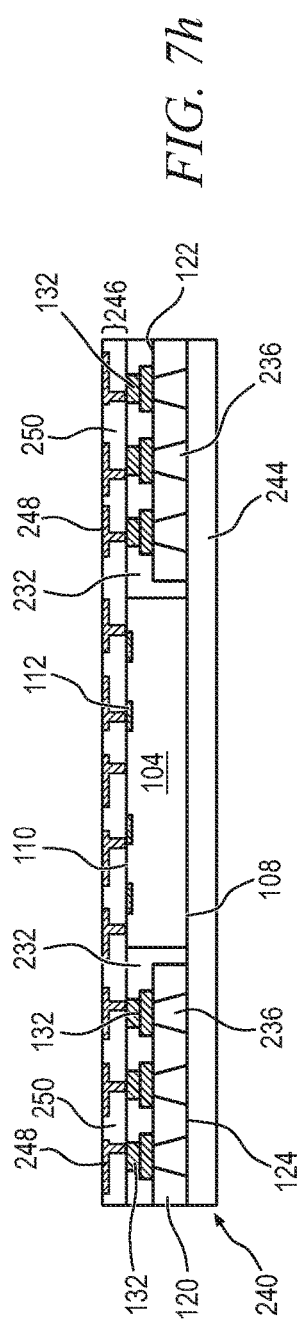
Figure 7I:
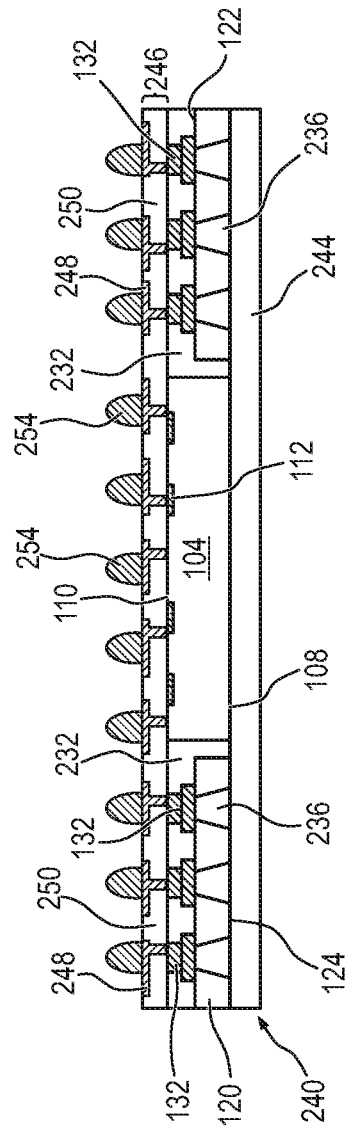

In FIG. 7h, build-up interconnect structure 246 containing conductive layers 248 and insulating layer 250 is formed over assembly 240. Conductive layers 248 contact conductive posts 132 and operate as a redistribution layer for vertical and horizontal electrical interconnect. FIG. 7i shows bumps 252 formed on conductive layer 248.

Figure 7J:
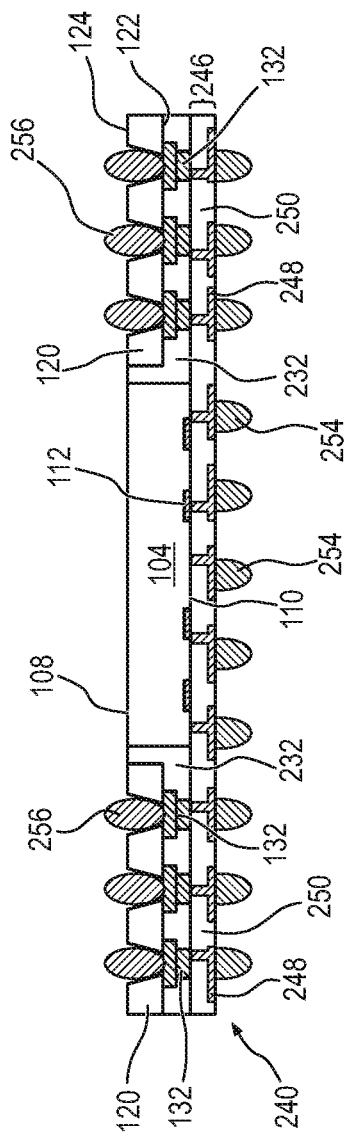

In FIG. 7j, assembly 240 is removed from carrier 244 by chemical etching, mechanical peel-off, CMP, mechanical grinding, thermal bake, laser scanning, or wet stripping to expose vias 236. An electrically conductive bump material is deposited within vias 236 over the exposed conductive posts 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive posts 132 using a suitable attachment or bonding process. In some embodiments, the bump material is reflowed by heating the material above its melting point to form balls or bumps 256. Bump 256 can also be compression bonded or thermocompression bonded to conductive posts 132. Bump 256 represents one type of interconnect structure that can be formed over conductive posts 132. The interconnect structure can also use bond wires, conductive paste, stud bump, micro bump, or other electrical interconnect.

Figure 8A:
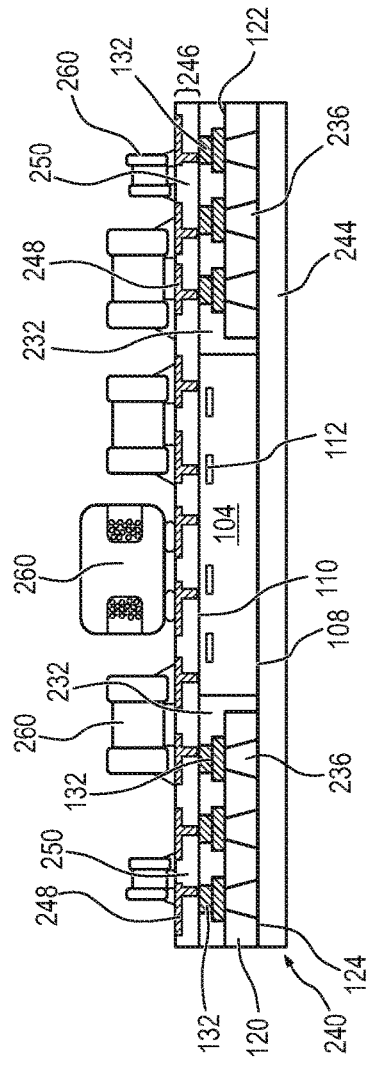
FIGS. 8a-8c illustrate the 3D SiP with a discrete component.

In another embodiment, continuing from FIG. 7h, discrete electrical components 260 are surface-mounted onto conductive layer 248 of interconnect structure 246, as shown in FIG. 8a. Discrete electrical components 260 are mechanically bonded and electrically connected to conductive layer 248 with solder or solder paste. In one embodiment, solder paste is printed onto interconnect structure 246, reflowed with discrete electrical components 260 in physical contact, and then defluxed. Discrete electrical components 260 include inductors, resistors, capacitors, transistors, diodes, and any combination of active and passive devices to implement the intended functionality of the 3D SiP.

Figure 8B:
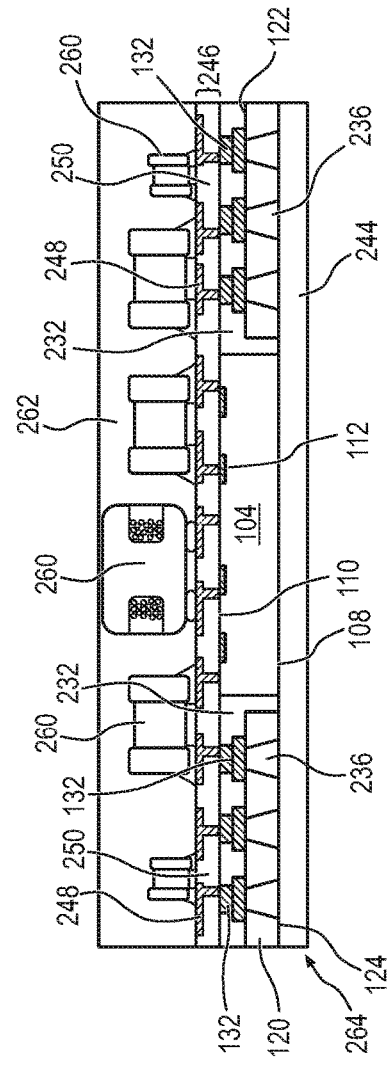

In FIG. 8b, an encapsulant or molding compound 262 is deposited around and over discrete electrical components 260 using a paste printing, compressive molding, transfer molding, liquid encapsulant molding, vacuum lamination, spin coating, or other suitable applicator. Encapsulant 262 can be polymer composite material, such as epoxy resin, epoxy acrylate, or polymer with or without a proper filler. Encapsulant 262 is non-conductive, provides structural support, and environmentally protects the semiconductor device from external elements and contaminants. FIG. 8b shows assembly 264 to the state of the manufacturing process.

Figure 8C:
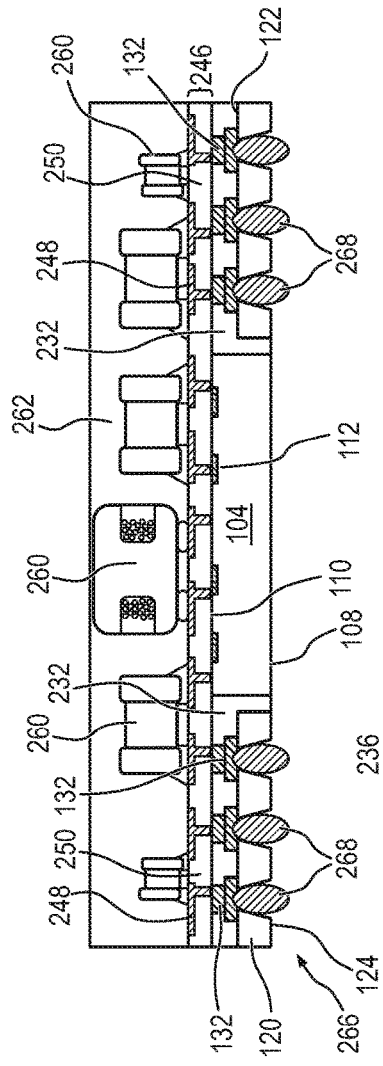

In FIG. 8c, assembly 264 is removed from carrier 244 by chemical etching, mechanical peel-off, CMP, mechanical grinding, thermal bake, laser scanning, or wet stripping to expose vias 236. FIG. 8c shows 3D SiP 266 with substrate 120 having conductive posts 132 (protrusion e-bar) around semiconductor die 104. An electrically conductive bump material is deposited within vias 236 over the exposed conductive posts 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive posts 132 using a suitable attachment or bonding process. In some embodiments, the bump material is reflowed by heating the material above its melting point to form balls or bumps 268. Bump 268 can also be compression bonded or thermocompression bonded to contact conductive posts 132. Bump 268 represents one type of interconnect structure that can be formed over conductive posts 132. The interconnect structure can also use bond wires, conductive paste, stud bump, micro bump, or other electrical interconnect.

The 3D SiP 266 with protrusion e-bar 120/132 or 160/166 or 162/166 provides vertical electrical interconnect for semiconductor die 104. Conductive posts 132/166 maintain stand-off, i.e., wide gap between substrate 120 and substrate 170, during reflow, as well improving flow of encapsulant 232. The protrusion e-bar also provides rigidity to reduce warpage and defects in bumps 256 or 268. Carrier 244 also provides warpage control. Conductive posts 132/166 reduces occurrence of an electrical bridge or short. The 3D SiP 266 can be formed at the wafer level.

FIG. 9 shows an alternate embodiment from FIGS. 8a-8c with shielding layer 270 formed over top surface 272 and side surface 274 of encapsulant 262, as well as the side surfaces of assembly 240. Shielding layer 270 can be one or more layers of Al, Cu, Sn, Ni, Au, Ag, or other suitable conductive material. Alternatively, shielding layer 270 can be carbonyl iron, stainless steel, nickel silver, low-carbon steel, silicon-iron steel, foil, conductive resin, carbon-black, aluminum flake, and other metals and composites capable of reducing the effects of EMI, RFI, and other inter-device interference.

FIG. 10 shows an embodiment similar to FIG. 9 with encapsulant 232 deposited over back surface 108 of semiconductor die 104.

Figure 11:
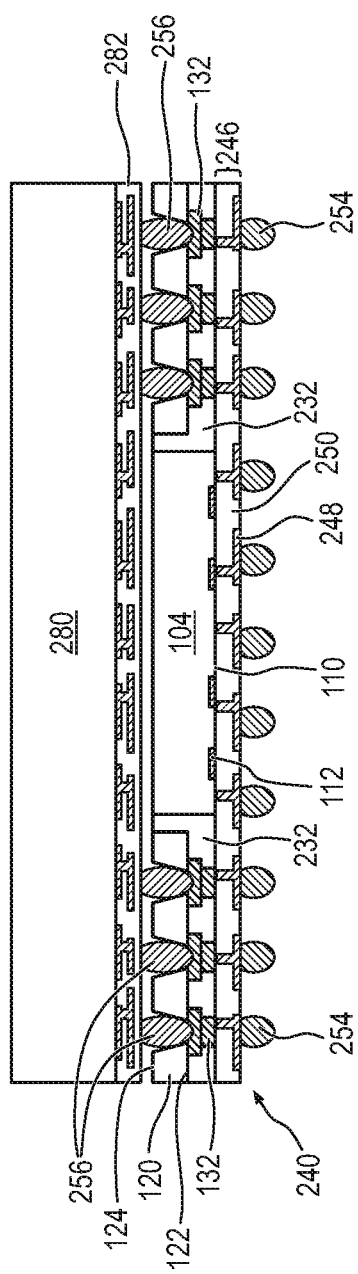
FIG. 11 illustrates the 3D SiP of FIGS. 7a-7j with a top semiconductor package.

FIG. 11 shows an embodiment with semiconductor package 280 and electrical interconnect substrate 282 mounted to assembly 240 from FIG. 7j in a package on package (PoP) arrangement.

Figure 12:
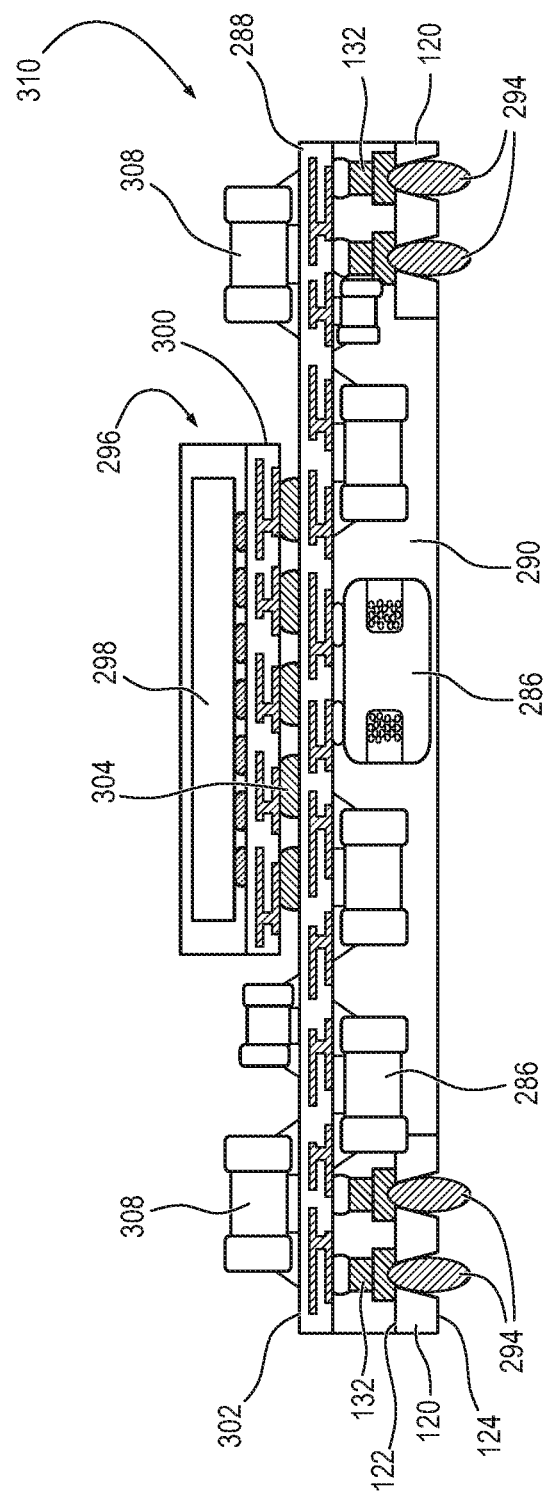
FIG. 12 illustrates another 3D SiP with a substrate having conductive posts around a discrete component.

FIG. 12 shows an embodiment with discrete electrical devices 286 mounted to electrical interconnect substrate 288. Protrusion e-bar 120 is disposed around discrete electrical devices 280. Encapsulant 290 is deposited around and over discrete electrical devices 280 and substrate 120 with conductive posts 132 (protrusion e-bar). Bumps 294 are formed within vias 186 of substrate 120 and contact conductive posts 132. Semiconductor package 296 with semiconductor die 298 and electrical interconnect substrate 300 is mounted to surface 302 of substrate 288 with bumps 304, opposite discrete electrical components 286. Additional discrete electrical components 308 are mounted to surface 302 to form 3D SiP 310.

Figure 13:
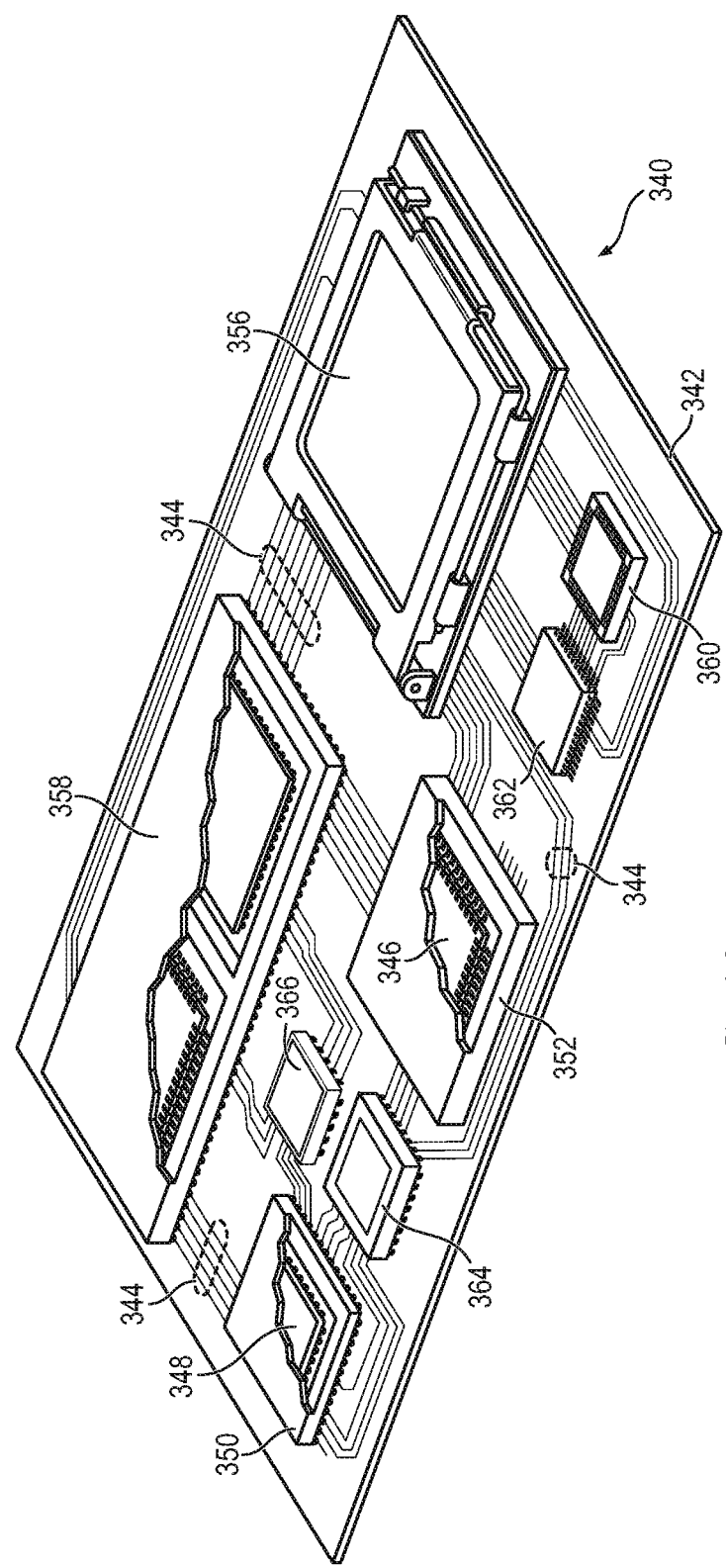
FIG. 13 illustrates a printed circuit board (PCB) with different types of packages mounted to a surface of the PCB.

FIG. 13 illustrates electronic device 340 having a chip carrier substrate or PCB 342 with a plurality of semiconductor packages mounted on a surface of PCB 342, including 3D SiP 194 or 266. Electronic device 340 can have one type of semiconductor package, or multiple types of semiconductor packages, depending on the application.

Electronic device 340 can be a stand-alone system that uses the semiconductor packages to perform one or more electrical functions. Alternatively, electronic device 340 can be a subcomponent of a larger system. For example, electronic device 340 can be part of a tablet, cellular phone, digital camera, communication system, or other electronic device. Alternatively, electronic device 340 can be a graphics card, network interface card, or other signal processing card that can be inserted into a computer. The semiconductor package can include microprocessors, memories, ASIC, logic circuits, analog circuits, RF circuits, discrete electrical components, or other semiconductor die or electrical components. Miniaturization and weight reduction are essential for the products to be accepted by the market. The distance between semiconductor devices may be decreased to achieve higher density.

In FIG. 13, PCB 342 provides a general substrate for structural support and electrical interconnect of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between each of the semiconductor packages, mounted components, and other external system components. Traces 344 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, embedded wafer level ball grid array (eWLB) 364, and wafer level chip scale package (WLCSP) 366 are shown mounted on PCB 342. In one embodiment, eWLB 364 is a fan-out wafer level package (Fo-WLP) and WLCSP 366 is a fan-in wafer level package (Fi-WLP). Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first interconnect substrate;
   a semiconductor die disposed over the first interconnect substrate;
   a second substrate including a stepped e-bar conductive post comprising a first conductive layer and a second conductive layer formed over the first conductive layer with the first conductive layer being wider than the second conductive layer, wherein the second conductive layer is disposed completely within boundaries of the first conductive layer and protrudes beyond a first surface of the second substrate and the second substrate is disposed over the first interconnect substrate with a via formed completely through the second substrate and aligned with the stepped e-bar conductive post; and an interconnect structure disposed within the via to contact the stepped e-bar conductive post and extending beyond a second surface of the second substrate opposite the first surface of the second substrate.

2. The semiconductor device of claim 1, further including an encapsulant deposited around the second substrate and semiconductor die.

3. The semiconductor device of claim 1, wherein a portion of the first conductive layer of the stepped e-bar conductive post is embedded within the second substrate.

4. The semiconductor device of claim 1, further including a semiconductor package disposed over the semiconductor device.

5. The semiconductor device of claim 1, further including a discrete electrical component disposed over a surface of the first interconnect substrate opposite the semiconductor die.

6. The semiconductor device of claim 5, further including a shielding layer formed over the discrete electrical component.

7. A semiconductor device, comprising:
a substrate including a stepped e-bar conductive post comprising a base and a first step from the base disposed completely within boundaries of the base, wherein the stepped e-bar conductive post extends beyond a surface of the substrate and a portion of the stepped e-bar conductive post is embedded within the substrate;
a semiconductor die disposed adjacent to the substrate with an opening extending completely through the substrate to the stepped e-bar conductive post;
a bonding material disposed over the first step; and
an interconnect structure disposed within the opening to contact the stepped e-bar conductive post.

8. The semiconductor device of claim 7, further including an encapsulant deposited around the substrate and semiconductor die.

9. The semiconductor device of claim 7, further including a semiconductor package disposed over the semiconductor device.

10. The semiconductor device of claim 7, further including a discrete electrical component disposed over a surface of the substrate opposite the semiconductor die.

11. The semiconductor device of claim 10, further including a shielding layer formed over the discrete electrical component.

12. The semiconductor device of claim 7, wherein the stepped e-bar conductive post includes:
a first conductive layer; and
a second conductive layer formed over the first conductive layer, wherein the first conductive layer is wider than the second conductive layer.

13. A semiconductor device, comprising:
a first interconnect substrate;
a semiconductor die disposed over the first interconnect substrate;
a second substrate including a stepped e-bar conductive post comprising a base and a first step from the base disposed completely within the base, wherein the stepped e-bar conductive post protrudes from a surface of the second substrate and is disposed over the first interconnect substrate and a portion of the stepped e-bar conductive post is embedded within the second substrate;
a bonding material disposed over the first step; and
an interconnect structure disposed within an opening formed completely through the second substrate and aligned with the stepped e-bar conductive post to contact the stepped e-bar conductive post.

14. The semiconductor device of claim 13, further including an encapsulant deposited around the second substrate and semiconductor die.

15. The semiconductor device of claim 13, wherein the stepped e-bar conductive post includes:
a first conductive layer; and
a second conductive layer formed over the first conductive layer, wherein the first conductive layer is wider than the second conductive layer.

16. The semiconductor device of claim 13, further including a discrete electrical component disposed over a surface of the first interconnect substrate opposite the semiconductor die.

17. The semiconductor device of claim 16, further including a shielding layer formed over the discrete electrical component.

18. A semiconductor device, comprising:
a substrate including a stepped e-bar conductive post comprising a base and a first step disposed completely within the base, wherein the stepped e-bar conductive post extends from a surface of the substrate and a portion of the stepped e-bar conductive post is embedded within the substrate;
a semiconductor die disposed adjacent to the substrate;
a bonding material disposed over the first step; and
an interconnect structure disposed within an opening extending completely through the substrate to contact the stepped e-bar conductive post.

19. The semiconductor device of claim 18, further including an encapsulant deposited around the substrate and semiconductor die.

20. The semiconductor device of claim 18, further including a discrete electrical component disposed over a surface of the substrate opposite the semiconductor die.

21. The semiconductor device of claim 20, further including a shielding layer formed over the discrete electrical component.

22. The semiconductor device of claim 18, wherein the stepped e-bar conductive post includes:
a first conductive layer; and
a second conductive layer formed over the first conductive layer, wherein the first conductive layer is wider than the second conductive layer.

* * * * *